United States Patent
Joo et al.

(10) Patent No.: US 10,686,440 B2
(45) Date of Patent: Jun. 16, 2020

(54) RF SWITCH WITH DIGITAL GATE THRESHOLD VOLTAGE

(71) Applicant: Integrated Device Technology, Inc., San Jose, CA (US)

(72) Inventors: Roberto Aparicio Joo, San Diego, CA (US); John Zhao, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/219,175

(22) Filed: Dec. 13, 2018

(65) Prior Publication Data
US 2019/0199347 A1 Jun. 27, 2019

Related U.S. Application Data

(60) Provisional application No. 62/608,806, filed on Dec. 21, 2017.

(51) Int. Cl.
| | |
|---|---|
| *H03K 17/693* | (2006.01) |
| *H03K 17/30* | (2006.01) |
| *H03K 17/687* | (2006.01) |
| *H03K 17/00* | (2006.01) |

(52) U.S. Cl.
CPC ......... *H03K 17/302* (2013.01); *H03K 17/005* (2013.01); *H03K 17/6872* (2013.01); *H03K 17/693* (2013.01); *H03K 2217/0054* (2013.01)

(58) Field of Classification Search
CPC .. H03K 17/302; H03K 17/693; H03K 17/005; H03K 17/6872; H03K 2217/0054; H03B 1/00; H01L 47/00; H01L 29/00; H04B 1/28; H04Q 7/20; H04M 1/00
See application file for complete search history.

(56) References Cited

U.S. PATENT DOCUMENTS

| | | | | |
|---|---|---|---|---|
| 5,956,580 A | * | 9/1999 | Wu | H01L 29/66613 257/E21.415 |
| 6,492,246 B1 | * | 12/2002 | Cho | H01L 21/26533 438/430 |
| 6,642,578 B1 | * | 11/2003 | Arnold | H01P 1/15 257/341 |
| 7,613,442 B1 | * | 11/2009 | Kelly | H03K 17/693 257/341 |

(Continued)

*Primary Examiner* — Dong-Chang Shiue
(74) *Attorney, Agent, or Firm* — Christopher P. Maiorana, PC

(57) ABSTRACT

A method of implementing a radio frequency (RF) switch comprises the steps of forming a first switch device on an integrated circuit substrate, forming a second switch device on the integrated circuit substrate, connecting the first switch device between a first pad and a second pad of the integrated circuit, connecting the second switch device between the second pad and a third pad of the integrated circuit, directly connecting a first control pad of the integrated circuit for receiving a first digital control signal to a control terminal of the first switch device, and directly connecting a second control pad of the integrated circuit for receiving a second digital control signal to a control terminal of the second switch device. A threshold voltage of the first and second switch devices is generally modified to allow being directly driven by the first digital control signal or the second digital control signal.

20 Claims, 5 Drawing Sheets

(56) References Cited

U.S. PATENT DOCUMENTS

2007/0120103 A1*  5/2007  Burgener .................. H01P 1/15
                                                       257/1
2015/0236691 A1*  8/2015  Cam ...................... H01Q 21/50
                                                       343/876
2015/0295066 A1* 10/2015  Grenouillet ....... H01L 29/42384
                                                       257/330

* cited by examiner

RF SWITCH WITH DIGITAL GATE THRESHOLD VOLTAGE

This application relates to U.S. Provisional Application No. 62/608,806, filed Dec. 21, 2017, which is hereby incorporated by reference in its entirety.

FIELD OF THE INVENTION

The invention relates to wireless communications circuits generally and, more particularly, to a method and/or apparatus for implementing an RF switch with a digital gate threshold voltage.

BACKGROUND

In wireless systems, a front-end module (FEM) provides an interface between an antenna and a radio frequency (RF) transceiver. A FEM typically includes power amplifiers, switches, low-noise amplifiers, control circuitry, and passive elements. Complex wireless systems, exemplified by smart phones, utilize large numbers of switches (e.g. antenna switch connecting to multiple RF chains, band selection, incorporating diversity antennae, etc.). A conventional switch needs a continuously on supply voltage and control bits to operate the switch devices. The continuously on supply voltage is used to generate internal voltages (Von and Voff), which operate the switch device with good performance. The digital control bits control the switch device by determining which of the internal voltages are routed to individual RF field effect transistor (FET) gates using respective input buffers. The continuously on supply voltage and internal voltage generator are an additional drain on a battery of the smart phone.

It would be desirable to implement an RF switch with a digital gate threshold voltage.

SUMMARY

The invention concerns a method of implementing a radio frequency (RF) switch comprising the steps of (i) forming a first switch device on an integrated circuit substrate where the first switch device comprises one or more first transistors connected in series, (ii) forming a second switch device on the integrated circuit substrate where the second switch device comprises one or more second transistors connected in series, (iii) connecting the first switch device between a first pad and a second pad of the integrated circuit, (iv) connecting the second switch device between the second pad and a third pad of the integrated circuit, (v) directly connecting a first control pad of the integrated circuit for receiving a first digital control signal to a control terminal of each of the one or more first transistors of the first switch device, and (vi) directly connecting a second control pad of the integrated circuit for receiving a second digital control signal to a control terminal of each of the one or more second transistors of the second switch device. A threshold voltage of each of the one or more first transistors of the first switch device and each of the one or more second transistors of the second switch device is generally modified to ensure switch operation in response to being directly driven by the first digital control signal or the second digital control signal.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing an RF switch with a digital gate threshold voltage that may (i) allow control bits to directly drive gates of switching devices, (ii) eliminate separate VCC voltage supply, (iii) eliminate an internal voltage generator to derive internal voltages from the VCC voltage supply, (iv) eliminate need for input buffers to select proper control voltages, (v) modify threshold voltage of one or more RF silicon on insulator (SOI) field effect transistors (FETs) in a switching device, (vi) modify a process for manufacturing switching devices utilizing RF SOI FETs, (vii) be implemented in switches with any number of poles and/or throws, and/or (viii) be implemented as one or more integrated circuits.

Figure 1:
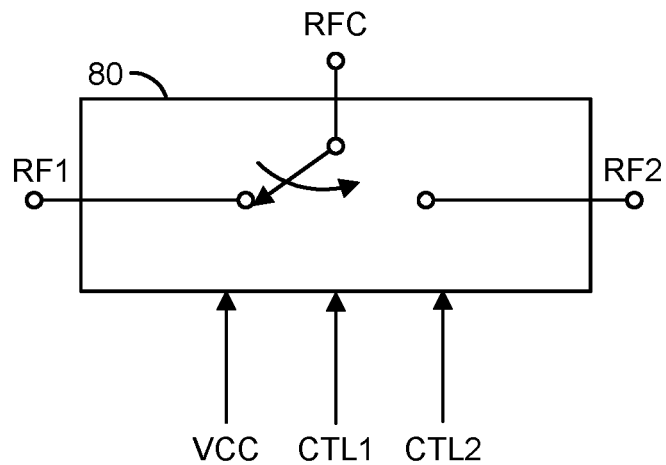
FIG. 1 is a block diagram of a typical single-pole double throw (SPDT) RF switch.

Referring to FIG. 1, a block diagram of a switch 80 is shown illustrating a typical RF switch. The switch 80 generally implements a single-pole double-throw (SPDT) switch. The switch 80 may have a first RF port (e.g., RF1), a second RF port (e.g., RF2), a third RF port (e.g., RFC), a supply voltage (e.g., VCC), a first control input (e.g., CTL1), and a second control input (e.g., CTL2). The RF port RFC generally implements a common (or input/output) RF port. The RF ports RF1 and RF2 generally implement complementary RF ports (e.g., RF1 implements an RF input and RF2 implements an RF output, or vice versa). The switch 80 generally provides three switch states: RFC connected to RF1, RFC connected to RF2, and RFC isolated from both RF1 and RF2. In an example, operation of the switch 80 relative to the supply and control inputs may be summarized as in the following TABLE 1:

TABLE 1

| VCC | CTL1 | CTL2 | Switch State |
|---|---|---|---|
| ON | OFF (or LOW) | OFF (or LOW) | Isolated |
| ON | ON (or HIGH) | OFF (or LOW) | RFC -> RF1 |
| ON | OFF (or LOW) | ON (or HIGH) | RFC -> RF2 |
| OFF | X | X | Disabled |

Figure 2:
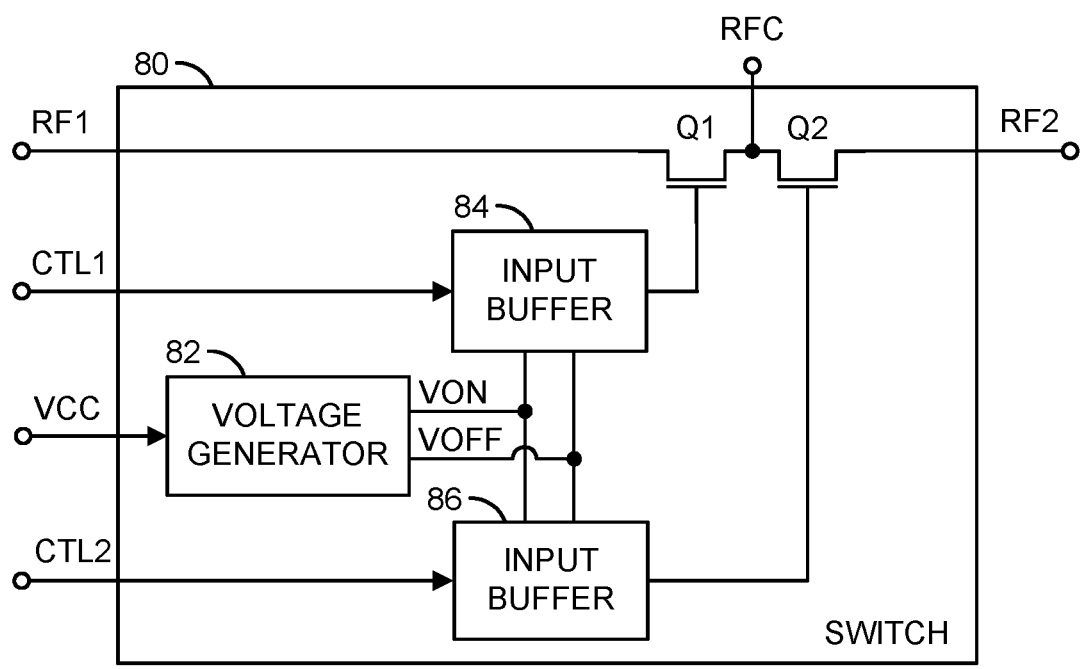
FIG. 2 is a diagram illustrating an example implementation of a typical SPDT RF switch.

Referring to FIG. 2, a diagram of the switch 80 is shown illustrating a typical implementation. In an example, the switch 80 may comprise a voltage generator 82, a first input buffer 84, a second input buffer 86, a first radio frequency (RF) field effect transistor (FET) Q1, and a second RF FET Q2. The supply voltage VCC may be presented to an input of the voltage generator 82. The voltage generator 82 may be configured to generate two or more internal voltages in response to the supply voltage VCC. In an example, the voltage generator 82 may have a first output that may present a first internal voltage level (e.g., VON) and a second output that may present a second internal voltage level (e.g., VOFF). The internal voltages VON and VOFF are generally based upon a typical gate threshold voltage (Vt) of the RF FETs Q1 and Q2.

In general, the typical gate threshold voltage Vt of the RF FETs Q1 and Q2 is approximately zero volts (0V). In an example, the voltage generator 82 may be configured to generate the first internal control voltage VON having a level sufficient to maintain the RF FETs Q1 and Q2 in a conducting (e.g., closed or ON) state and the second internal control voltage VOFF having a level sufficient to maintain the RF FETs Q1 and Q2 in a non-conducting (e.g., open or OFF) state. The first and the second internal voltage levels VON and VOFF are generally configured to provide proper operation of the switch 80 (e.g., with a predetermined level of performance).

In an example, the voltage VON implements an ON voltage configured to provide proper operation of the switch 80 in the conducting (ON) state. In an example, the voltage VOFF implements an OFF voltage configured to provide proper operation of the switch in the non-conducting (OFF) state. The voltage VOFF is generally significantly lower than the gate threshold voltage Vt to ensure the transistor Q1 or Q2 to which VOFF is applied remains in the non-conducting (OFF) state. The voltage VON is generally significantly higher than the gate threshold voltage Vt to ensure the particular transistor Q1 or Q2 to which VON is applied remains in the conducting (ON) state.

The input buffer 84 is generally configured to select either the first internal control voltage VON or the second internal control voltage VOFF for routing to the gate of the RF FET Q1 based upon a state of the control input CTL1. The input buffer 86 is generally configured to select either the first internal control voltage VON or the second internal control voltage VOFF for routing to the gate of the RF FET Q2 based upon a state of the control input CTL2. In general, the control inputs CTL1 and CTL2 are configured to place only one of the RF FETs Q1 and Q2 in the conductive state at any given time.

Figure 3:
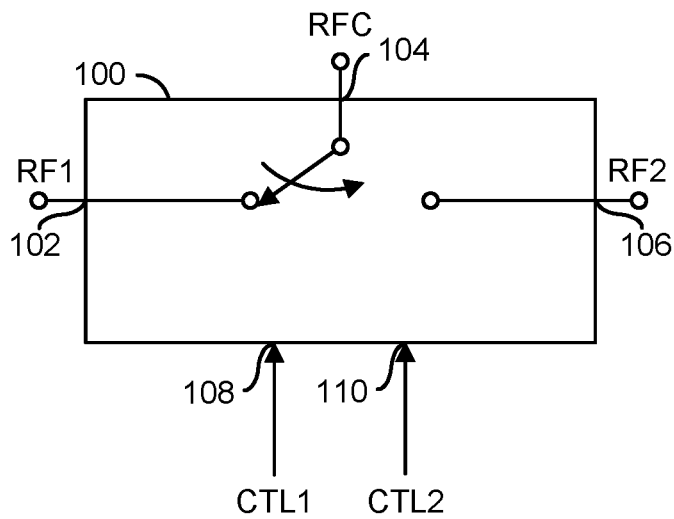
FIG. 3 is a block diagram of a SPDT RF switch in accordance with an example embodiment of the invention.

Referring to FIG. 3, a block diagram of a switch 100 is shown illustrating an example of an RF switch in accordance with an example embodiment of the invention. The switch 100 generally implements a single-pole double throw (SPDT or SP2T) switch. However, other numbers of poles and/or throws may be implemented accordingly to meet the design criteria of a particular application. The switch 100 may have a first RF port 102, a second RF port 104, a third RF port 106, a first control input 108, and a second control input 110. The RF port 104 generally implements a common (or input/output) RF port (e.g., RFC). The RF port 102 may be configured to receive or present a first RF signal (e.g., RF1). The RF port 106 may be configured to receive or present a second RF signal (e.g., RF2). The first control input 108 may be configured to receive a first control signal or bit (e.g., CTL1). The second control input 110 may be configured to receive a second control signal or bit (e.g., CTL2). The control signals (or bits) CTL1 and CTL2 generally control the switch state of the switch 100 directly.

In an embodiment implementing a single-pole double throw (SPDT) switch, the switch 100 may provide three switch states: RF port 104 connected to RF port 102, RF port 104 connected to RF port 106, and RF port 104 isolated from both RF port 102 and RF port 106. In an example, operation of the switch 100 relative to the control signals CTL1 and CTL2 may be summarized as in the following TABLE 2:

TABLE 2

| CTL1 | CTL2 | Switch State |
|---|---|---|
| OFF (e.g., LOW or logic 0) | OFF (e.g., LOW or logic 0) | Isolated |
| ON (e.g., HIGH or logic 1) | OFF (e.g., LOW or logic 0) | RFC -> RF1 |
| OFF (e.g., LOW or logic 0) | ON (e.g., HIGH or logic 1) | RFC -> RF2 |

In various embodiments, the control signals CTL1 and CTL2 may be implemented as digital control signals (or bits). In an example, the signals CTL1 and CTL2 may be implemented having a digital LOW state represented by a voltage of approximately 0V and a digital HIGH state represented by a voltage of approximately 3.3V. In various embodiments, the switch 100 generally eliminates a need for internal voltages derived from a supply voltage (e.g., VCC, VDD, etc.) and, therefore, eliminates the need for the continuously on supply voltage itself, a voltage generator, and input buffers corresponding to each control signal. Thus, the switch 100 generally utilizes less die area than traditional switches.

Figure 4:
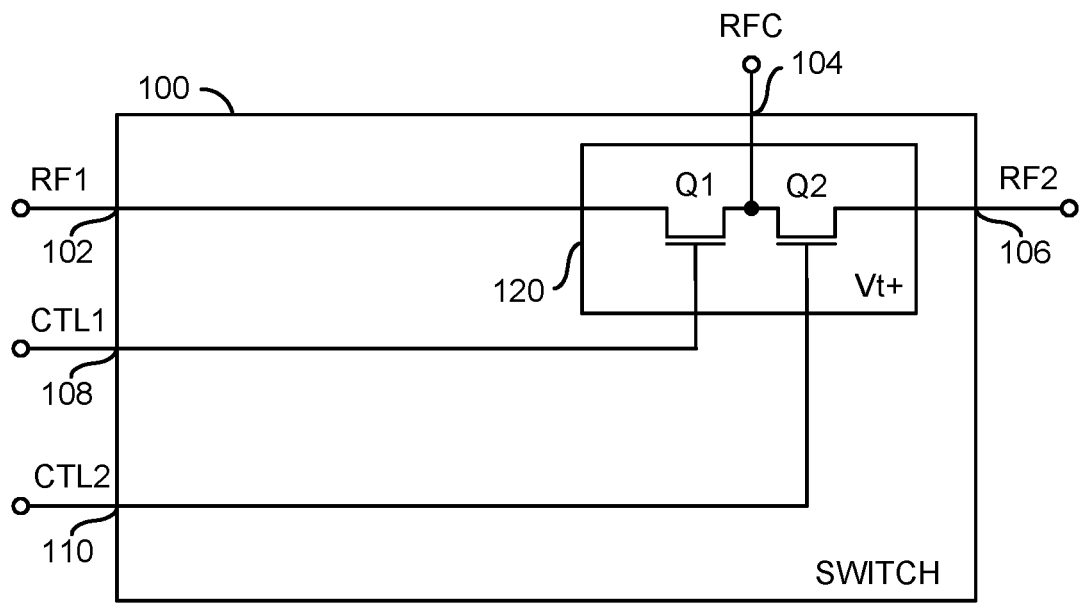
FIG. 4 is a diagram illustrating an example implementation of a SPDT RF switch in accordance with an example embodiment of the invention.

Referring to FIG. 4, a diagram of the switch 100 is shown illustrating an example implementation of a SPDT switch in accordance with an example embodiment of the invention. In an example, the switch 100 may comprise a first RF FET Q1 and a second RF FET Q2. Each of the RF FETs Q1 and Q2 may be implemented as one or more field effect transistors. In an example, each of the RF FETs Q1 and Q2 may be implemented as a plurality of stacked FETs. In various embodiments, each of the RF switches Q1 and Q2 may be implemented as a number of devices (e.g., transistors) stacked in series. In an example, the switches Q1 and Q2 may be implemented with n devices, where n is an integer number (e.g., 1, 2, 8, 10, 24, etc.). In an example, each of the switches Q1 and Q2 may be implemented with a different number devices.

Field effect transistors (FETs) are typically used in cellular applications to meet low power demands of cellular applications. The FETs making up the switches Q1 and Q2 may be stacked to handle the relatively high (e.g., tens of volts) RF voltages found in wireless applications. The term stacked is used to describe a configuration where the drain of one transistor is the source of the next transistor. In an example, the relatively high RF input voltage is spread out among the individual devices in the stack of transistors making up the switches Q1 and Q2, reducing the voltage across each individual device, in order to prevent breakdown. Stacking the devices may be performed because the drain-to-source breakdown voltage ($BV_{DS}$) and the drain-to-gate breakdown voltage ($BV_{DG}$) of a single FET may be on the order of 2 to 4 volts (V) (3.5V typically) depending on the particular process technology, while the RF signals may be on the order of 20 or more volts. The individual transistors of each stack may also be configured to more evenly distribute the RF voltage. By stacking the devices, the relatively high voltage typically used in most RF front-end modules is dispersed over several (e.g., typically twelve or more), so that the voltage across any one device is relatively small, making breakdown unlikely. Ideally, each of the devices in the stack should have substantially the same drain-to-source voltage.

In an example, the switches Q1 and Q2 receive the control signals CTL1 and CTL2, respectively. When the respective control signal is held LOW, the corresponding switch (RF FET) is generally in a non-conducting state (e.g., open or OFF), blocking signals from passing through. When the respective control signal is held HIGH, the corresponding switch (RF FET) is generally in a conducting state (e.g., closed or ON), allowing the signals to pass through. In an example, when the control signal CTL1 is held HIGH and the control signal CTL2 is held LOW, the RF FET Q1 allows signals to pass from the RF port 102 to the common RF port 104 and the RF FET Q2 blocks signals to/from the RF port 106. When the control signal CTL1 is held LOW and the control signal CTL2 is held HIGH, the RF FET Q2 allows signals to pass from the RF common port 104 to the RF port 106 and the RF FET Q1 blocks signals to/from the RF port 102.

The RF FETs Q1 and Q2 are generally configured to allow the gates of the RF FETs Q1 and Q2 to be directly driven by the digital control signals (or bits) CTL1 and CTL2, respectively. In various embodiments, the signals CTL1 and CTL2 may be implemented to be compliant with one or more digital logic standards (e.g., CMOS, TTL, etc.). In an example, a portion (or region) 120 of an integrated circuit die in which the RF FETs Q1 and Q2 are instantiated may have a modified process that significantly raises a gate threshold voltage (e.g., Vth) of the RF FETs Q1 and Q2. In an example, the modification to the process of the portion 120 may include, but is not limited to, modifying a doping level in the portion 120 to raise the gate threshold Vth, modifying a gate oxide thickness in the portion 120 to raise the gate threshold Vth, modifying a buried oxide (BOX) thickness to raise the gate threshold, applying a back (substrate) bias level to the portion 120 to raise the gate threshold Vth, implementing a buried gate to allow modification of the gate threshold Vth, and/or some other technique of increasing the gate threshold Vth in the region 120 encompassing the RF FETs Q1 and Q2. In an example, ion implantation may be performed in the substrate layer 130 beneath the insulator (e.g., BOX) layer 132 to achieve a desired gate threshold voltage Vth. In another example, the substrate layer 130 beneath the RF FETs Q1 and Q2 may be forward back biased (FBB) or reverse back biased (RBB) to achieve a desired gate threshold voltage Vth.

In an example, the signals CTL1 and CTL2 may be implemented having a digital LOW state represented by a voltage of approximately 0V and a digital HIGH state represented by a voltage of approximately 3.3V. The signals CTL1 and CTL2 may be presented directly to the gate terminals of the RF FETs Q1 and Q2. The modified gate threshold voltage of the RF FETs Q1 and Q2 generally allow (i) the digital LOW voltage of about 0V to be sufficient to keep the RF FETs Q1 and Q2 OFF and (ii) the digital HIGH voltage of about 3.3V to be sufficient to keep the RF FETs Q1 and Q2 ON.

In an example, the non-conducting (OFF) path of the switch 100 may be modified to provide proper operation in response to the digital LOW voltage of about 0V and the conducting (ON) path of the switch 100 may be modified to provide proper operation in response to the digital HIGH voltage of about 3.3V. However, the gate threshold voltage of the RF FETs Q1 and Q2 may be modified for other representative digital HIGH and LOW voltage levels to meet the design criteria of a particular application.

Figure 5:
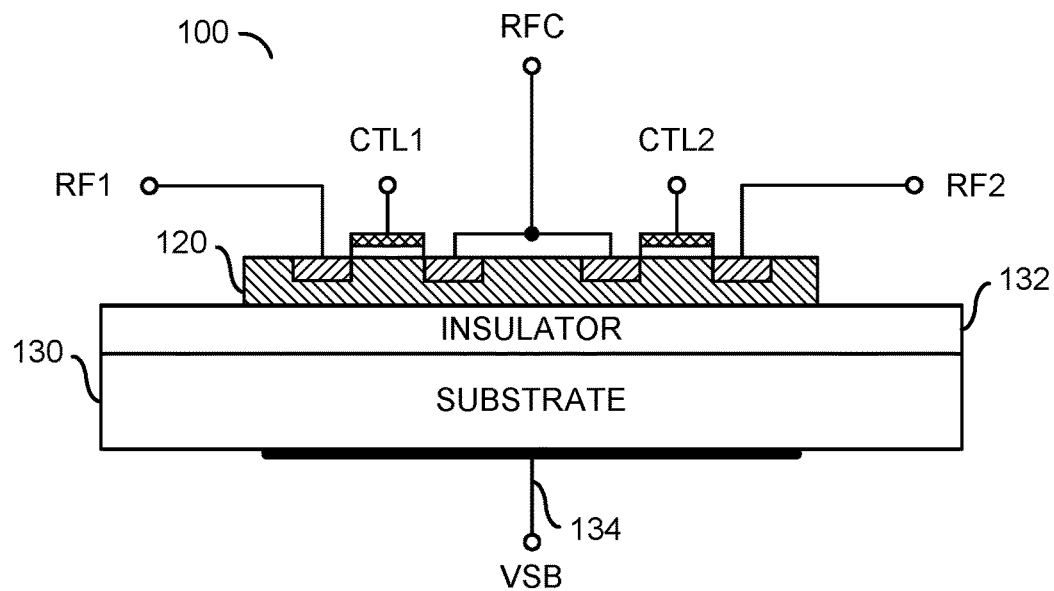
FIG. 5 is a diagram illustrating a cross-sectional view of a SPDT RF switch in accordance with an example embodiment of the invention.

Referring to FIG. 5, a diagram is shown illustrating a cross-sectional view of a SPDT RF switch implemented in accordance with an example embodiment of the invention. In an example, the switch 100 may be implemented using silicon on insulator (SOI) technology. In an example, the switch 100 may comprise a substrate layer 130 and an insulator layer 132. The substrate layer 130 may comprise a silicon substrate. The insulator layer 132 may comprise silicon dioxide ($SiO_2$). In an example, the insulator layer 132 may implement a buried oxide (BOX) layer. The portion 120 may be part of a silicon layer disposed on the insulator layer 132. A connection 134 may be disposed on a surface (e.g., backside) of the substrate 130 opposite the insulator layer 132 to allow application of a back bias voltage (e.g., VSB). The RF FETs Q1 and Q2 may be formed in the portion 120.

Figure 6:
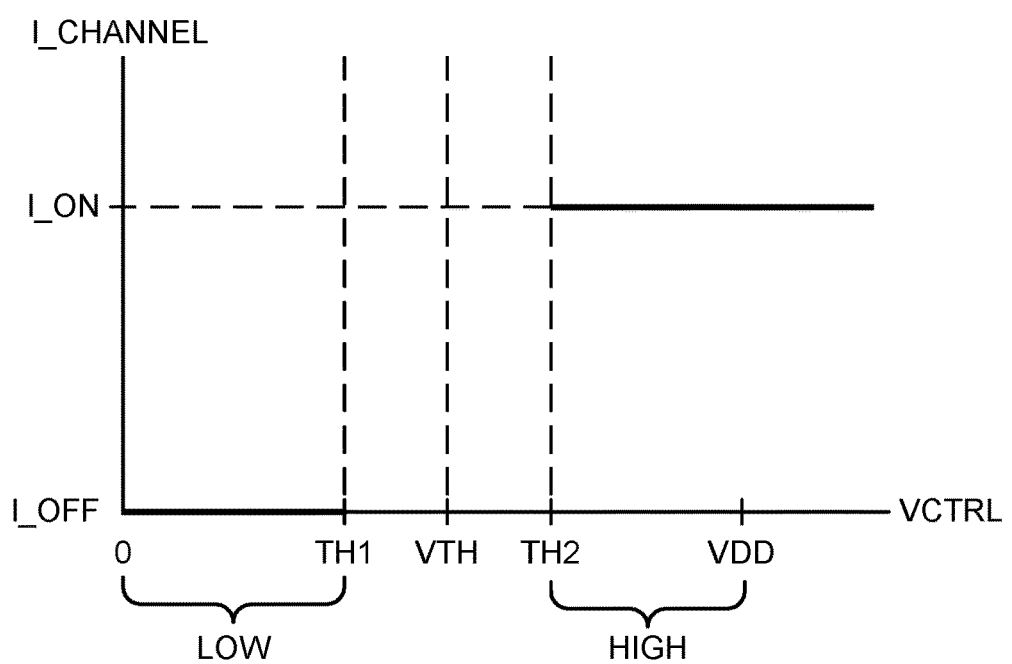
FIG. 6 is a diagram illustrating a digital gate threshold in accordance with an example embodiment of the invention.

Referring to FIG. 6, a diagram of a graph 150 is shown illustrating a digital gate threshold in accordance with an example embodiment of the invention. In various embodiments, the circuit 100 is configured such that a gate threshold voltage Vth of the RF FETs Q1 and Q2 is higher than conventional RF FETs. In various embodiments, the gate threshold voltage Vth of the RF FETs Q1 and Q2 are significantly increased above the typical RF FET value of about zero volts. The gate threshold voltage Vth of the RF FETs Q1 and Q2 are generally higher than a range of voltages (e.g., 0 to TH1) corresponding to a digital LOW, and lower than a range of voltages (e.g., TH2 to VDD) corresponding to a digital HIGH. The RF FETs Q1 and Q2 implemented in accordance with an embodiment of the invention generally allow a digital LOW voltage (e.g., of about 0V) to be sufficient to keep a channel of the RF FETs Q1 and Q2 in a non-conducting state (or OFF) and a digital HIGH voltage of about 3.3V to be sufficient to keep the channel of the RF FETs Q1 and Q2 in a conducting state (or ON).

Figure 7:
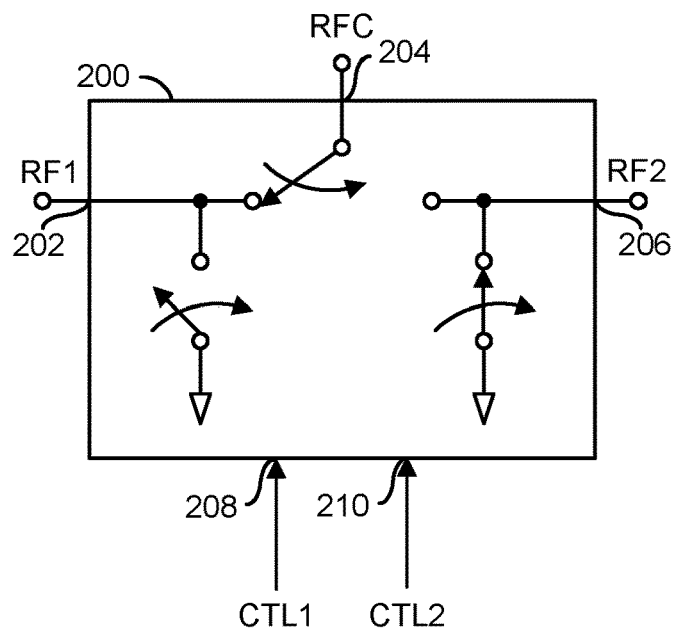
FIG. 7 is a block diagram of a SPDT RF switch in accordance with another example embodiment of the invention.

Referring to FIG. 7, a block diagram of a switch 200 is shown illustrating an example of an RF switch in accordance with another example embodiment of the invention. The switch 200 generally implements an RF switch comprising both series and shunt switches. In an example, the switch 200 may be implemented as a single-pole double throw (SPDT or SP2T) switch. However, other numbers of poles and/or throws may be implemented accordingly to meet the design criteria of a particular application. The switch 200 may have a first RF port 202, a second RF port 204, a third RF port 206, a first control input 208, and a second control input 210. The RF port 202 may be configured to receive or present a first RF signal (e.g., RF1). The RF port 204 generally implements a common (or input/output) RF port (e.g., RFC). The RF port 206 may be configured to receive or present a second RF signal (e.g., RF2). The first control input 208 may be configured to receive a first control signal or bit (e.g., CTL1). The second control input 210 may be configured to receive a second control signal or bit (e.g., CTL2). The control signals (or bits) CTL1 and CTL2 generally control the switch state of the switch 200 directly.

In an embodiment implementing a single-pole double throw (SPDT) switch, the switch 200 may provide three switch states: RF port 204 connected to RF port 102, RF port 204 connected to RF port 206, and RF port 204 isolated from both RF port 202 and RF port 206. In an example, operation of the switch 200 relative to the control signals CTL1 and CTL2 may be summarized as in the following TABLE 3:

TABLE 3

| CTL1 | CTL2 | Switch State |
|---|---|---|
| OFF (e.g., LOW or logic 0) | OFF (e.g., LOW or logic 0) | Isolated |
| ON (e.g., HIGH or logic 1) | OFF (e.g., LOW or logic 0) | RFC -> RF1 |
| OFF (e.g., LOW or logic 0) | ON (e.g., HIGH or logic 1) | RFC -> RF2 |

The control signals CTL1 and CTL2 are generally implemented as digital control signals (or bits). In an example, the signals CTL1 and CTL2 may be implemented having a digital LOW state represented by a voltage of approximately 0V and a digital HIGH state represented by a voltage of approximately 3.3V. In various embodiments, the switch 200 generally eliminates a need for internal voltages derived from a continuously on supply voltage (e.g., VCC, VDD, etc.) and, therefore, eliminates the need for the continuously on supply voltage itself, a voltage generator, and input buffers corresponding to each control signal. Thus, the switch 200 may be implemented using less die area than traditional switches.

Figure 8:
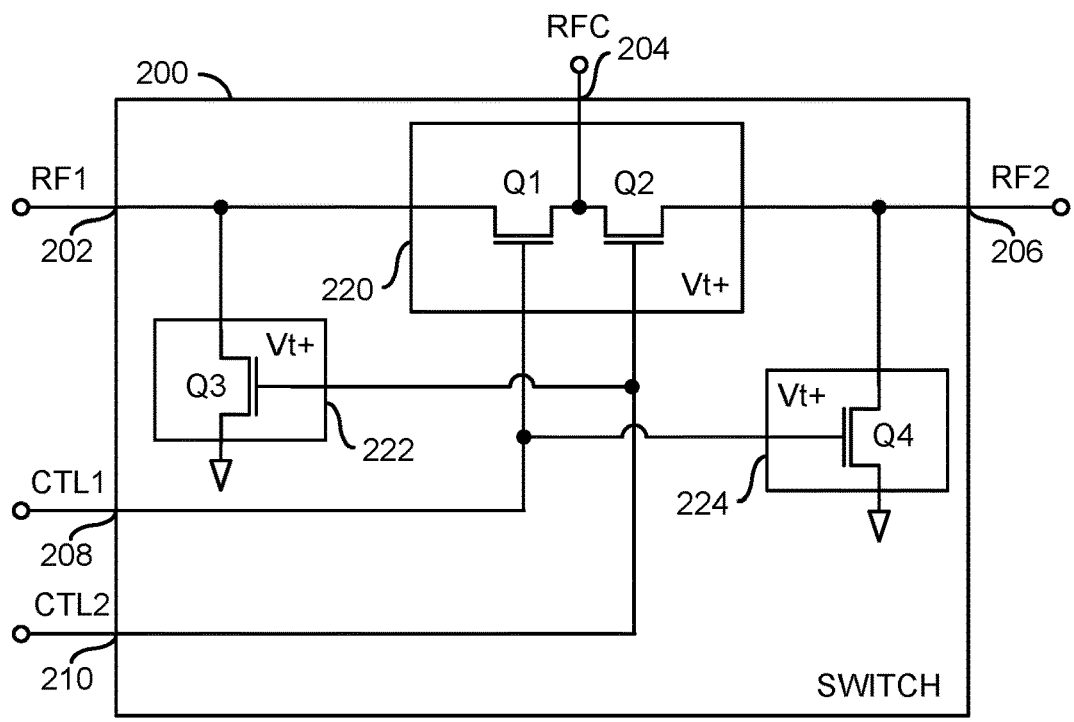
FIG. 8 is a diagram illustrating another example implementation of a SPDT switch in accordance with an example embodiment of the invention.

Referring to FIG. 8, a diagram of the switch 200 is shown illustrating an example implementation of a single-pole double throw (SPDT) switch in accordance with an example embodiment of the invention. In an example, the switch 200 may comprise a first series RF FET Q1, a second series RF FET Q2, a first shunt RF FET Q3, and a second shunt RF FET Q4. Each of the RF FETs Q1-Q4 may be implemented as one or more field effect transistors. In an example, each of the RF FETs Q1-Q4 may be implemented as a plurality of stacked FETs. In various embodiments, each of the RF switches Q1-Q4 may be implemented as a number of devices (e.g., transistors) stacked in series. In an example, the switches Q1-Q4 may be implemented with n devices, where n is an integer number (e.g., 1, 2, 8, 10, 24, etc.). In an example, each of the switches Q1Q4 may be implemented with a different number devices. In an example, the RF FETs Q1 and Q4 may be configured to allow the gates of the RF FETs Q1 and Q4 to be directly driven by the digital control signal (or bit) CTL1, and the RF FETs Q2 and Q3 may be configured to allow the gates of the RF FETs Q2 and Q3 to be directly driven by the digital control signal (or bit) CTL2. However, additional control signals may be implemented accordingly to allow separate (independent) control of the RF FETs Q1-Q4.

The switch 200 generally provides three switch states: 1) RF port 204 connected to RF port 202 and RF port 206 tied to ground; 2) RF port 204 connected to RF port 206 and RF port 202 tied to ground; and 3) both RF port 202 and RF port 206 isolated from RF port 204 and ground. In an example, operation of the switch 200 relative to the control signals CTL1 and CTL2 may be summarized as in the following TABLE 4:

TABLE 4

| CTL1 | CTL2 | Switch State |
|---|---|---|
| OFF (or LOW) | OFF (or LOW) | Isolated |
| ON (or HIGH) | OFF (or LOW) | RFC -> RF1 and RF2 -> GND |
| OFF (or LOW) | ON (or HIGH) | RFC -> RF2 and RF1 -> GND |

The control signals CTL1 and CTL2 are generally implemented as digital control signals (or bits). In an example, the signals CTL1 and CTL2 may be implemented having a digital LOW state represented by a voltage of approximately 0V and a digital HIGH state represented by a voltage of approximately 3.3V. In various embodiments, the switch 200 generally eliminates a need for internal voltages derived from a continuously on supply voltage (e.g., VCC, VDD, etc.) and, therefore, eliminates the need for the continuously on supply voltage itself, the internal voltage generator, and the input buffers found in conventional switches.

In an example, one or more portions (regions) of an integrated circuit die in which the RF FETs Q1-Q4 are instantiated may have a modified process that significantly raises the gate threshold voltage of the RF FETs Q1-Q4. A portion 220 of the integrated circuit die may have a modified process that significantly raises the gate threshold voltage of the RF FETs Q1 and Q2. A portion 222 of the integrated circuit die may have a modified process that significantly raises the gate threshold voltage of the RF FET Q3. A portion 224 of the integrated circuit die may have a modified process that significantly raises the gate threshold voltage of the RF FET Q4. The regions 220, 222, and 224 may be implemented similarly to the region 120 described above in connection with FIGS. 4 and 5.

In an example, the signals CTL1 and CTL2 may be implemented having a digital LOW state represented by a voltage of approximately 0V and a digital HIGH state represented by a voltage of approximately 3.3V. The signals CTL1 and CTL2 may be presented directly to the respective gates of the RF FETs Q1-Q4. The modified gate threshold voltages of the RF FETs Q1-Q4 generally allow (i) the digital LOW voltage of about 0V to be sufficient to keep the RF FETs Q1-Q4 in an OFF (non-conducting) state and (ii) the digital HIGH voltage of about 3.3V to be sufficient to keep the RF FETs Q1-Q4 in an ON (conducting) state.

In an example, the modification to the process of the portions 220, 222, and 224 may include, but is not limited to, modifying a doping level in the portions 220, 222, and 224 to raise the gate threshold Vth, modifying a gate oxide thickness in the portions 220, 222, and 224 to raise the gate threshold Vth, modifying a buried oxide (BOX) thickness in the portions 220, 222, and 224 to raise the gate threshold, applying a back (substrate) bias level to the portions 220, 222, and 224 to raise the gate threshold Vth, implementing a buried gate in the portions 220, 222, and 224 to allow modification of the gate threshold Vth, and/or some other technique of increasing the gate threshold Vth in the portions 220, 222, and 224 encompassing the RF FETs Q1-Q4. In embodiments implementing the switch 200 using SOI technology, ion implantation may be performed in a substrate layer of the portions 220, 222, and 224 beneath an insulator (e.g., BOX) layer to achieve a desired gate threshold voltage Vth. In another example, the substrate layer beneath the RF FETs Q1-Q4 may be forward back biased (FBB) or reverse back biased (RBB) to achieve a desired gate threshold voltage Vth. In general, any process modification that allows modification of the threshold voltage of the transistors of the RF switches Q1-Q4 may be utilized to practice the invention.

In various embodiments, the transistors Q1-Q4 described above may be implemented using at least one of a metal-oxide-semiconductor (MOS) transistor, a field-effect transistor, or a pseudomorphic high electron mobility transistor (pHEMT). In various embodiments, the transistors Q1-Q4 may be implemented using various semiconductor materials (e.g., Si, Ge, GaAs, MOS, CMOS, SOI, etc.). In an example, the transistors Q1-Q4 may comprise the same number and/or size transistors. In another example, the transistors Q1-Q4 may comprise different numbers and/or sizes of transistors. In an example, the transistors Q1-Q4 may be implemented using a silicon on insulator (SOI) process technology.

Figure 9:
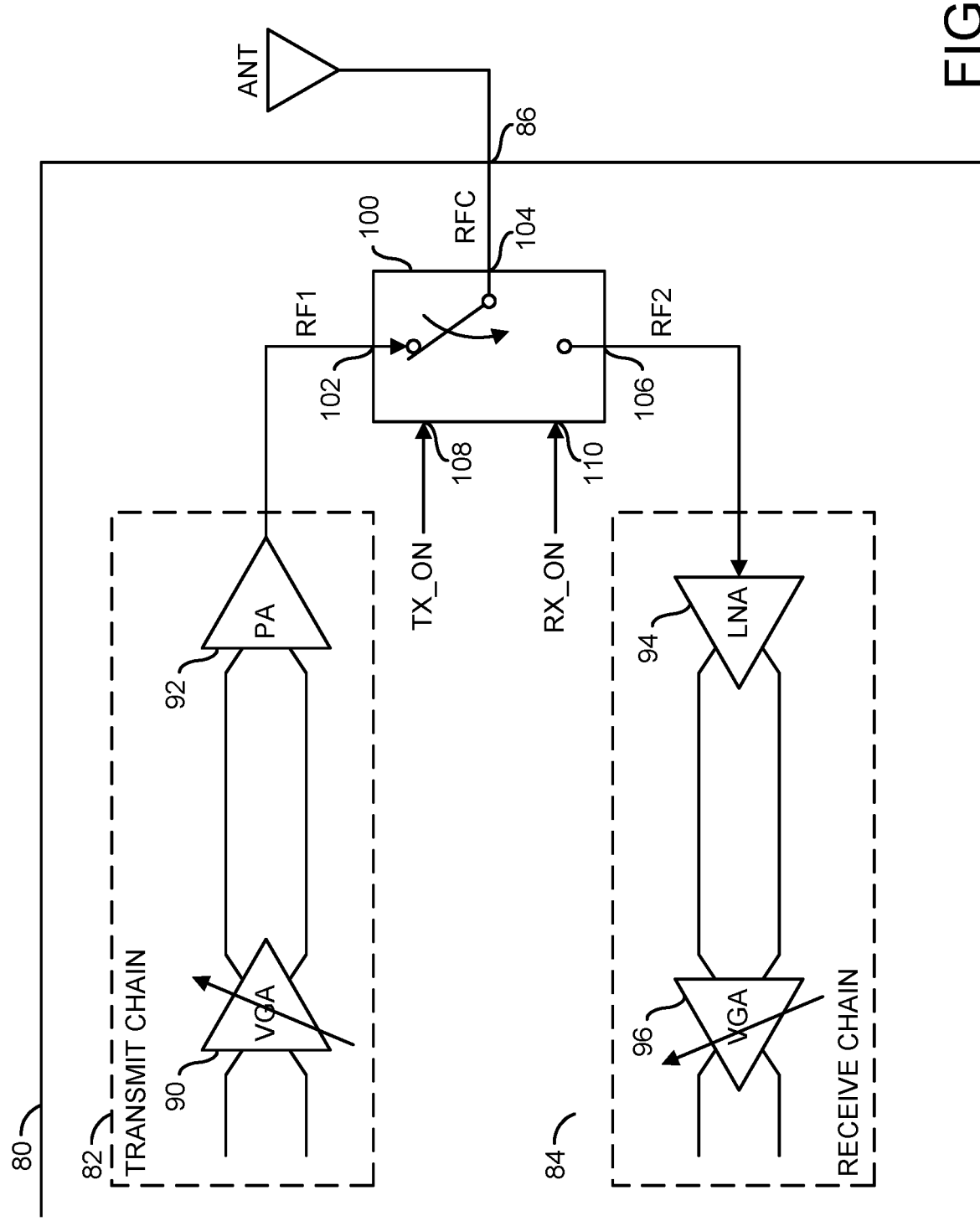
FIG. 9 is a diagram illustrating an example context in which an RF switch in accordance with an example embodiment of the invention may be implemented.

Referring to FIG. 9, a block diagram of a circuit 80 is shown illustrating an example application of the switch 100 in accordance with an embodiment of the invention. In an example embodiment, the circuit 80 may implement a transceiver. A transceiver is capable of both transmitting and receiving signals of a communication channel. In various embodiments, the circuit 80 may be capable of transmitting and receiving radio frequency (RF), microwave, and/or millimeter-wave signals. In various embodiments, the circuit 80 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and portable handheld devices (UEs).

In an example, the circuit 80 may comprise a block (or circuit) 82, a block (or circuit) 84, and an antenna port 86. In an example, the circuit 82 may be implemented as a stand alone transmitter circuit. In another example, the circuit 82 may be implemented as a transmit chain of a transceiver integrated circuit. In an example, the circuit 84 may be implemented as a stand alone receiver circuit. In another example, the circuit 84 may be implemented as a receive chain of the transceiver integrated circuit embodying the transmit chain 82.

In an example, the transmitter or transmit chain 82 may comprise a first (input) amplifier 90 and a second (output) amplifier 92. In an example, the amplifier 90 may be implemented as a variable gain amplifier (VGA) and the amplifier 92 may be implemented as a power amplifier (PA). The VGA amplifier 90 may be coupled, directly or indirectly through other components, to the power amplifier 92. In various embodiments, the circuit 82 may further comprise one or more of additional components (e.g., RF amplifiers, IF amplifiers, RF mixers, digital step attenuators (DSAs), broadband modulators, wideband voltage variable attenuators, etc.), not shown.

In an example, the receive chain 84 may comprise a first (input) amplifier 94 and a second (output) amplifier 96. In an example, the amplifier 94 may be implemented as a low noise amplifier (LNA) and the amplifier 96 may be implemented as a variable gain amplifier (VGA). The LNA 94 may be coupled, directly or indirectly through other components, to the VGA 96. In various embodiments, the circuit 84 may further comprise one or more of additional components (e.g., filters, limiters, RF amplifiers, IF amplifiers, RF mixers, digital step attenuators (DSAs), broadband demodulators, wideband voltage variable attenuators, etc.), not shown.

In an example, the transmitter or transmit chain 82, the receiver or receive chain 84, and the antenna port 86 may be coupled together via the circuit 100. In an example, the circuit 100 may be implemented as a stand alone integrated circuit. In another example, the circuit 100 may be integrated, along with the transmit chain 82 and the receive chain 84, within a transceiver integrated circuit.

In an example, the first port 102 may be coupled to an output of the transmitter or transmit chain 82. The common port 104 may be coupled to the antenna port 86. The second port 106 may be coupled to an input of the receiver or receive chain 84. The control input 108 may receive a signal (e.g., TX_ON). The signal TX_ON may implement a control signal for switching on a transmit mode where a signal is directed from the first port 102 to the common port 104. The control input 110 may receive a signal (e.g., RX_ON). The signal RX_ON may implement a control signal for switching on a receive mode where a signal is directed from the common port 104 to the second port 106. In an example, the signals TX_ON and RX_ON may be generated in response to a signal (e.g., T/R). In an example, the signals T/R, TX_ON, and RX_ON may be implemented as summarized in the following TABLE 5:

TABLE 5

| T/R | TX_ON | RX_ON |
|---|---|---|
| LOW (receive mode) | LOW | HIGH |
| HIGH (transmit mode) | HIGH | LOW |

The signals TX_ON and RX_ON may be presented either directly to the inputs 108 and 110, respectively, or through a conditioning circuit (e.g., where a clean control signal cannot be guaranteed due to overshoot, undershoot, ringing, etc.). In embodiments implementing a transmit/receive (T/R) switch, the signals TX_ON and RX_ON are generally implemented with complementary levels.

Although embodiments of the invention may have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, etc.) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method of controlling a radio frequency (RF) switch on an integrated circuit comprising the steps of:

forming a first switch device in a region on an integrated circuit substrate of said integrated circuit having a modified process, wherein said first switch device comprises one or more first transistors connected in series;

forming a second switch device in said region on said integrated circuit substrate having said modified process, wherein said second switch device comprises one or more second transistors connected in series;

connecting said first switch device between a first RF pad and a second RF pad of said integrated circuit;

connecting said second switch device between said second RF pad and a third RF pad of said integrated circuit;
directly connecting a first control pad of said integrated circuit for receiving a first digital control signal to a gate terminal of each of said one or more first transistors of said first switch device; and
directly connecting a second control pad of said integrated circuit for receiving a second digital control signal to a gate terminal of each of said one or more second transistors of said second switch device,
wherein said modified process of said region on said integrated circuit substrate raises a threshold voltage of each of said one or more first transistors of said first switch device and each of said one or more second transistors of said second switch device to a voltage level that is (i) higher than a first range of voltages corresponding to a digital LOW level of said first and said second digital control signals, and (ii) lower than a second range of voltages corresponding to a digital HIGH level of said first and said second digital control signals, ensuring switch operation in response to being directly driven by said first digital control signal or said second digital control signal.

2. The method according to claim 1, wherein said first transistors and said second transistors comprise field effect transistors.

3. The method according to claim 2, wherein (i) said threshold voltage comprises a gate threshold voltage and (ii) said first and said second ranges of voltages are compliant with at least one digital logic standard.

4. The method according to claim 1, wherein said switches are formed using a silicon-on-insulator process.

5. The method according to claim 1, wherein said switches are formed using a complementary metal-oxide-semiconductor silicon-on-insulator process.

6. The method according to claim 1, wherein said RF switch is part of a wireless communications circuit.

7. The method according to claim 1, wherein said RF switch is part of a fifth generation wireless communications circuit.

8. The method according to claim 1, wherein said process is modified by at least one of (i) modifying a doping level in the region to raise the threshold voltage, (ii) modifying a gate oxide thickness in the region to raise the threshold voltage, (iii) modifying a buried oxide (BOX) layer thickness in the region to raise the threshold voltage, (iv) applying a back (substrate) bias level to the region to raise the threshold voltage, or (v) implementing a buried gate to allow modification of the threshold voltage.

9. The method according to claim 8, wherein said process is modified by performing ion implantation in the substrate beneath the BOX layer.

10. The method according to claim 8, wherein said process is modified by forward back biasing or reverse back biasing the integrated circuit substrate beneath the region.

11. A radio frequency (RF) switch on an integrated circuit die comprising:
a first switch device disposed in a region on an integrated circuit substrate of said integrated circuit die having a modified process and connected between a first RF pad and a second RF pad of said integrated circuit die, wherein said first switch device comprises one or more first transistors connected in series;
a second switch device disposed in said region on said integrated circuit substrate having said modified process and connected between said second RF pad and a third RF pad of said integrated circuit die, wherein said second switch device comprises one or more second transistors connected in series;
a first control pad of said integrated circuit die for receiving a first digital control signal connected directly to a gate terminal of each of said one or more first transistors of said first switch device; and
a second control pad of said integrated circuit die for receiving a second digital control signal directly connected to a gate terminal of each of said one or more second transistors of said second switch device,
wherein said modified process of said region on said integrated circuit substrate raises a threshold voltage of each of said one or more first transistors of said first switch device and each of said one or more second transistors of said second switch device to a voltage level that is (i) higher than a first range of voltages corresponding to a digital LOW level of said first and said second digital control signals, and (ii) lower than a second range of voltages corresponding to a digital HIGH level of said first and said second digital control signals, ensuring switch operation in response to being directly driven by said first digital control signal or said second digital control signal.

12. The RF switch according to claim 11, wherein said first transistors and said second transistors comprise field effect transistors.

13. The RF switch according to claim 12, wherein (i) said threshold voltage comprises a gate threshold voltage and (ii) said first and said second ranges of voltages are compliant with at least one digital logic standard.

14. The RF switch according to claim 11, wherein said switches are formed using a silicon-on-insulator process.

15. The RF switch according to claim 11, wherein said switches are formed using a complementary metal-oxide-semiconductor silicon-on-insulator process.

16. The RF switch according to claim 11, wherein said RF switch is part of a wireless communications circuit.

17. The RF switch according to claim 11, wherein said RF switch is part of a fifth generation wireless communications circuit.

18. The RF switch according to claim 11, wherein said process is modified by at least one of (i) modifying a doping level in the region to raise the threshold voltage, (ii) modifying a gate oxide thickness in the region to raise the threshold voltage, (iii) modifying a buried oxide (BOX) layer thickness in the region to raise the threshold voltage, (iv) applying a back (substrate) bias level to the region to raise the threshold voltage, or (v) implementing a buried gate to allow modification of the threshold voltage.

19. The RF switch according to claim 18, wherein said process is modified by ion implantation in the substrate beneath the BOX layer.

20. The RF switch according to claim 18, wherein said process is modified by forward back biasing or reverse back biasing the integrated circuit substrate beneath the region.

* * * * *